United States Patent
Hsu et al.

(10) Patent No.: US 7,247,530 B2
(45) Date of Patent: Jul. 24, 2007

(54) ULTRATHIN SOI TRANSISTOR AND METHOD OF MAKING THE SAME

(75) Inventors: Sheng Teng Hsu, Camas, WA (US); Jong-Jan Lee, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 374 days.

(21) Appl. No.: 11/050,495

(22) Filed: Feb. 1, 2005

(65) Prior Publication Data

US 2006/0172475 A1    Aug. 3, 2006

(51) Int. Cl.
*H01L 21/338*    (2006.01)

(52) U.S. Cl. ............... 438/183; 438/321; 438/926; 438/E21.443

(58) Field of Classification Search ............ 438/183, 438/321, 926
See application file for complete search history.

(56) References Cited

U.S. PATENT DOCUMENTS

| | | | |
|---|---|---|---|
| 5,962,872 A * | 10/1999 | Zhang et al. ............ 257/66 |
| 6,352,899 B1 | 3/2002 | Sakiyama et al. | |
| 6,677,612 B2 * | 1/2004 | Akram ................. 257/69 |
| 6,709,913 B2 | 3/2004 | Hsu | |
| 2004/0259297 A1* | 12/2004 | Inumiya et al. ......... 438/183 |

* cited by examiner

*Primary Examiner*—Dung A. Le
(74) *Attorney, Agent, or Firm*—David C. Ripma

(57) ABSTRACT

A method of fabricating an ultrathin SOI memory transistor includes preparing a substrate, including forming an ultrathin SOI layer of the substrate; adjusting the threshold voltage of the SOI layer; depositing a layer of silicon oxide on the SOI layer; patterning and etching the silicon oxide layer to form a sacrificial oxide gate in a gate region; depositing a layer of silicon nitride and forming the silicon nitride into a silicon nitride sidewall for the sacrificial oxide gate; depositing and smoothing a layer of amorphous silicon; selectively etching the sacrificial gate oxide; growing a layer of oxide in the gate region; depositing and smoothing a second layer of amorphous silicon; patterning and etching the second layer of amorphous silicon; implanting ion to form a source region and a drain region; annealing the structure; and depositing a layer of passivation oxide.

9 Claims, 4 Drawing Sheets

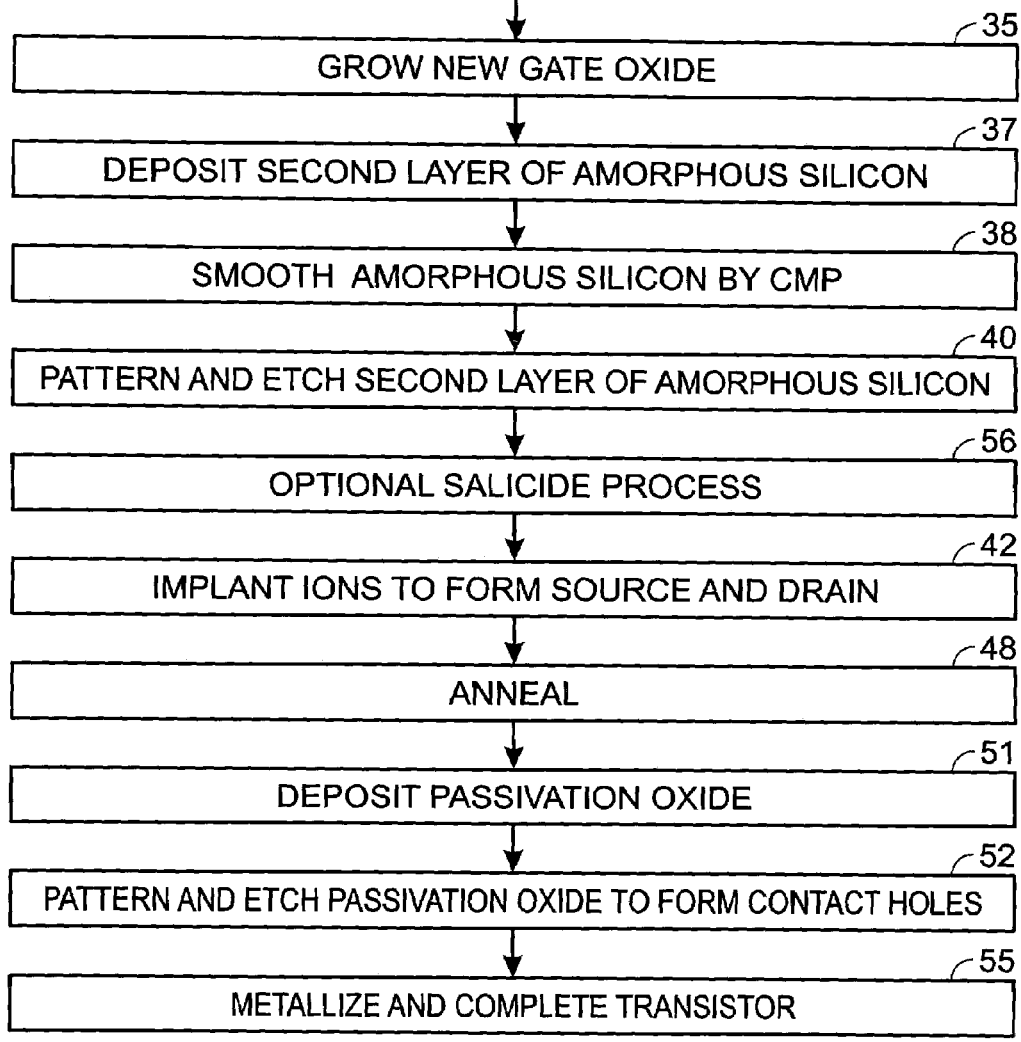

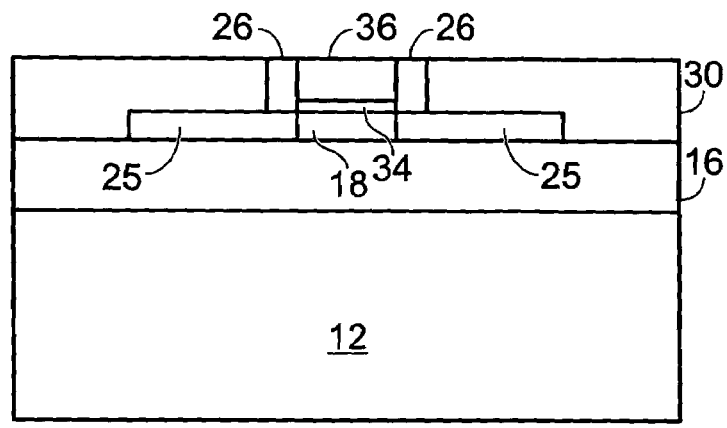
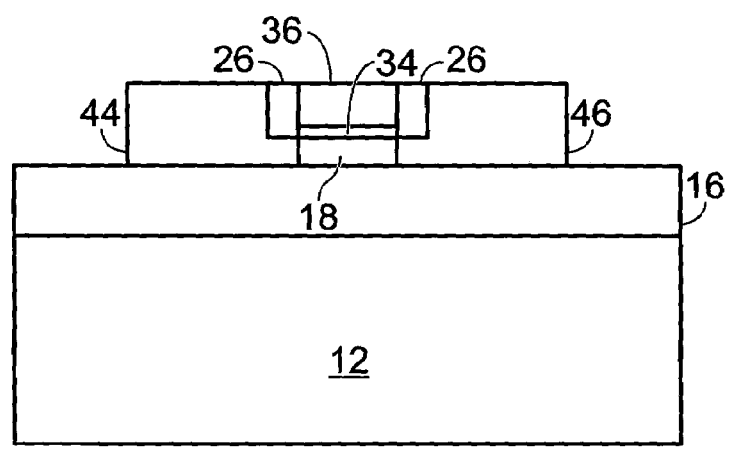
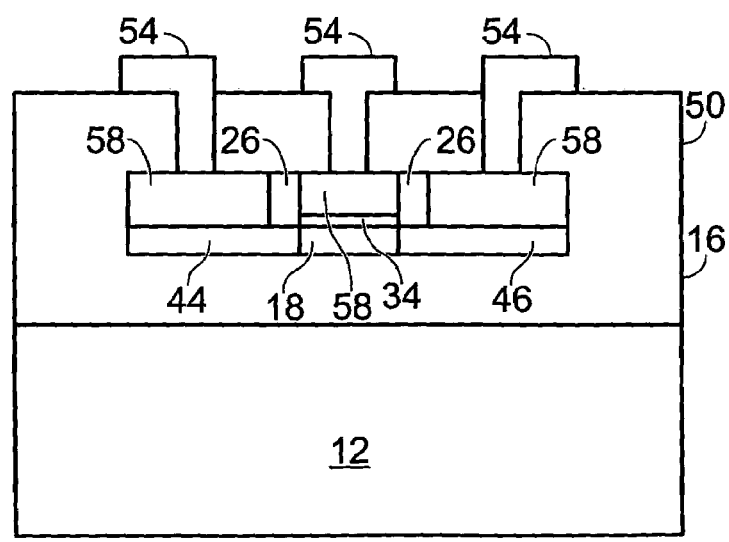

ULTRATHIN SOI TRANSISTOR AND METHOD OF MAKING THE SAME

FIELD OF THE INVENTION

This invention relates to large-scale non-volatile and embedded memory transistors, and specifically, to an ultrathin transistor fabricated on a SOI substrate.

BACKGROUND OF THE INVENTION

There are three state-of-the art approaches for fabrication of ultra-thin semiconductor devices on silicon-on-insulator (SOI) substrates:
(1) The conventional process is fabrication without a raised source or drain. The thickness of silicon at the source/drain is the same as that of the channel region. This structure yields high source/drain parasitic resistance which degrades the device performance.
(2) In a channel thinning process, the SOI film at the channel region is thinned prior to gate oxidation. The disadvantage of this process is that the thinned SOI film region is extended out of the channel region by at least one lithography alignment tolerance. As a result the parasitic resistance in the channel region is large, and a high drive current cannot be obtained.
(3) In a raised source/drain process, after formation of the gate electrode and LDD ion implantation, an insulating sidewall is formed about the gate electrode. Silicon is selectively grown on the source/drain region and is silicided. The selective deposition of silicon or silicide has a relatively large pattern sensitive effect. That is the thickness of the selective deposition layer is thicker in the low density area and is thinner in the high density area. Therefore, the uniformity and reproducibility are poor.

Another method of fabricating an SOI transistor uses non-selective deposition of silicide, followed by CMP, etch back, and mask etching to remove unwanted silicide. The process has a set back of additional silicidation of silicon during post annealing or metal alloy process, which may consume too much silicon for ultrathin SOI film, causing voids, hence increasing the source/drain parasitic resistance.

SUMMARY OF THE INVENTION

A method of fabricating an ultrathin SOI transistor includes preparing a substrate, including forming an ultrathin SOI layer of the substrate; adjusting the threshold voltage of the SOI layer; depositing a layer of silicon oxide on the SOI layer; patterning and etching the silicon oxide layer to form a sacrificial oxide gate in a gate region; depositing a layer of silicon nitride and forming the silicon nitride into a silicon nitride sidewall for the sacrificial oxide gate; depositing a layer of amorphous silicon; smoothing the layer of amorphous silicon by CMP; selectively etching the sacrificial gate oxide; growing a layer of oxide in the gate region; depositing a second layer of amorphous silicon; smoothing the second layer of amorphous silicon by CMP; patterning and etching the first layer of amorphous silicon; implanting ion to form a source region and a drain region; annealing the structure to activate and diffuse the implanted ions; depositing a layer of passivation oxide; patterning and etching the passivation oxide to form contact holes; and metallizing the structure to complete the memory transistor.

This summary of the invention is provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 1A and 1B provide a block diagram of the method of the invention.
FIGS. 2-8 depict the ultrathin SOI transistor of the invention is various stages of fabrication.

DETAILED DESCRIPTION OF THE PREFERRED EMBODIMENTS

Figure 1A:
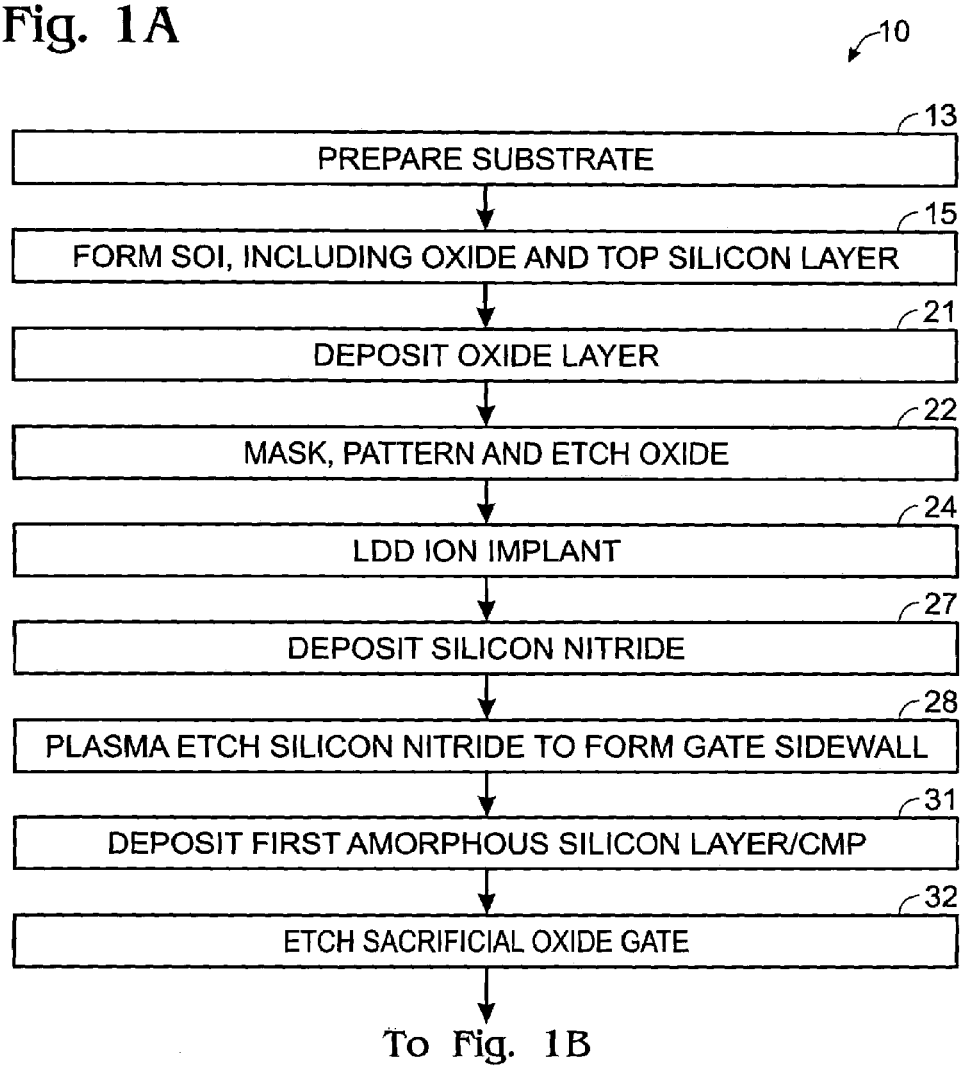
Figure 2:
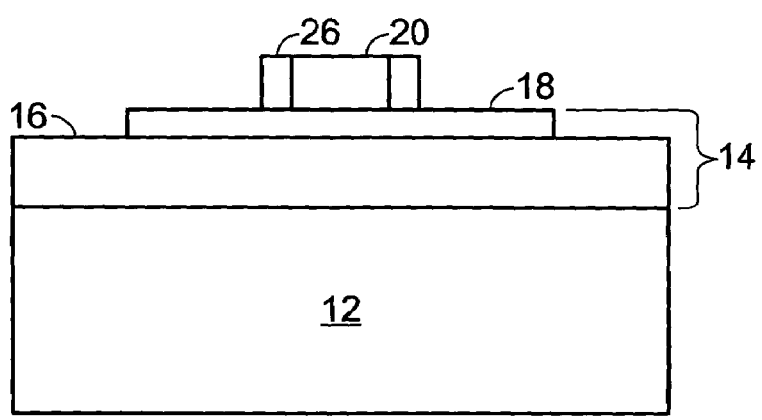
Figure 3:
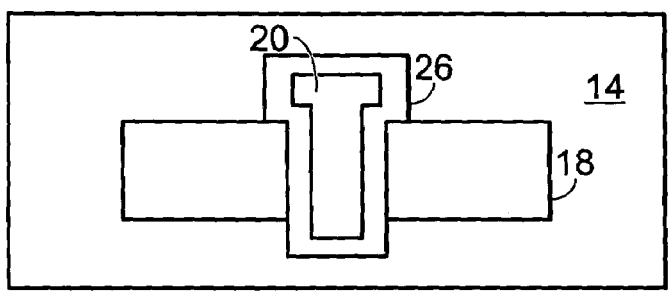

The method of the invention is depicted generally at 10 in FIG. 1, which refers to the combination of FIG. 1A and FIG. 1B. A substrate 12, and now referring to FIGS. 1-3, is prepared, block 13, including preparation of an ultrathin silicon-on-insulator (SOI) film 14 on the substrate, block 15. SOI film 14 includes an oxide layer 16 formed on substrate 12 and a layer of silicon 18, also referred to herein as a top silicon layer, and may be prepared using any state of the art process, such as SIMOX, or bonded process. The thickness of top silicon film 18 is between about 10 nm to 20 nm. The threshold voltage adjustment method is described in U.S. Pat. No. 6,709,913, to Hsu, granted Mar. 23, 2004, for *Method for Adjusting Ultra-Thin SOI MOS Transistor Threshold Voltages*. After the threshold voltage adjustment the preferred process includes depositing between about 100 nm to 500 nm of silicon oxide 20, block 21. The silicon oxide has a layer of photoresist applied and patterned, after which the silicon oxide is photo mask etched 22 as a sacrificial gate. LDD ion implantation 24 follows.

A layer of silicon nitride 26, having a thickness of between about 10 nm to 50 nm, is deposited, block 27. The silicon nitride is plasma etched 28 to form a nitride sidewall on the sacrificial gate oxide, as shown in FIG. 2, which is a cross-section view, and FIG. 3, which is a top plan view.

Figure 4:
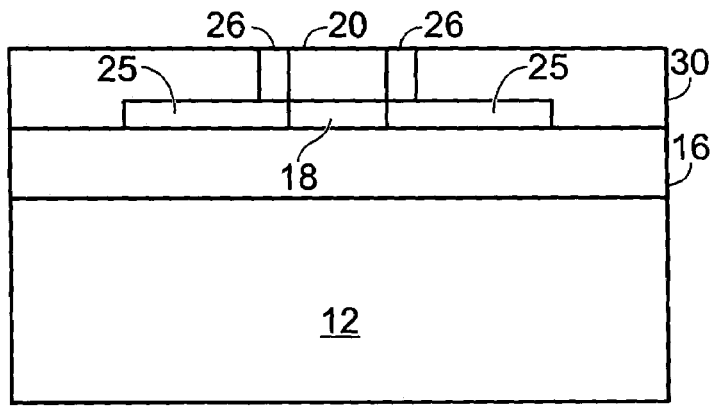

A layer of amorphous silicon 30, having a thickness of between about 200 nm to 700 nm, is deposited and smoothed by CMP, block 31, as shown in FIGS. 1 and 4.

Figure 5:
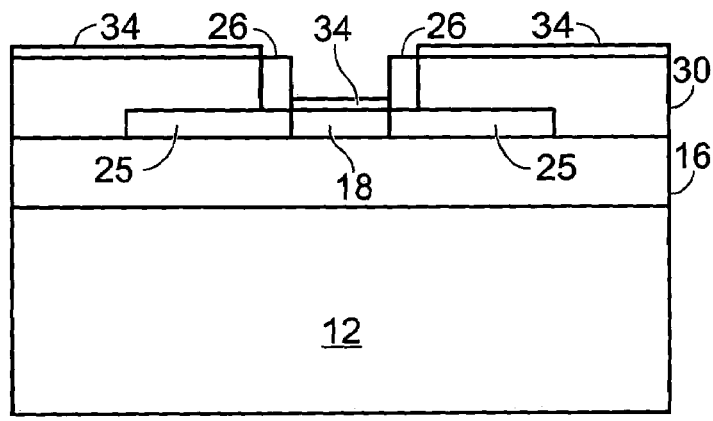

Referring to FIG. 5, sacrificial oxide gate 20 is selectively etched 32, and a new gate oxide 34 is grown, block 35. As shown in FIGS. 1 and 6, a second layer of amorphous silicon 36 is deposited 37 to a thickness of between about 200 nm to 700 nm. Second amorphous silicon layer 36 is smoothed by CMP, block 38. Photoresist is applied and patterned, followed by etching of amorphous silicon layer 30, block 40.

Ion implantation 42 of phosphorus or boron ions to form a source 44 and a drain 46 is performed. The ions are projected to a depth that is about the middle of amorphous silicon layer, as shown in FIG. 7.

The structure is annealed 48 at temperature of between about 500° C. to 800° C. for between about 10 minutes to 60 minutes to diffuse the implanted ions. A layer of passivation oxide 50 is deposited, block 51. Again, photoresist is applied and patterned prior to etching contact holes 52, and metallization 54, as shown in FIG. 1, block 55, and FIG. 8.

If salicidation is preferred, after selective etching of 100 nm to 200 nm of amorphous silicon, any state-of-the-art salicide process 56 may be employed, e.g., deposit between about 5 nm to 10 nm of a refractory metal, such as Ti, Pt, or Ni, sinter at between about 400° C. to 800° C. for between about 20 second to 60 seconds, and wet etch to remove the non-reacted refractory metal. The silicide 58 may consume all of the amorphous silicon but will not consume all of the underlying top silicon shown in FIG. 8.

Thus, a ultrathin SOI transistor and method of making the same has been disclosed. It will be appreciated that further variations and modifications thereof may be made within the scope of the invention as defined in the appended claims.

We claim:

1. A method of fabricating an ultrathin SOI memory transistor, comprising:
   preparing a substrate, including forming an ultrathin SOI layer of the substrate;
   adjusting the threshold voltage of the SOI layer;
   depositing a layer of silicon oxide on the SOI layer;
   patterning and etching the silicon oxide layer to form a sacrificial oxide gate in a gate region;
   depositing a layer of silicon nitride and forming the silicon nitride into a silicon nitride sidewall for the sacrificial oxide gate;
   depositing a first layer of amorphous silicon;
   smoothing the first layer of amorphous silicon by CMP;
   selectively etching the sacrificial gate oxide;
   growing a layer of oxide in the gate region;
   depositing a second layer of amorphous silicon;
   smoothing the second layer of amorphous silicon by CMP;
   patterning and etching the first layer of amorphous silicon;
   implanting ions to form a source region and a drain region;
   annealing the structure to diffuse the implanted ions;
   depositing a layer of passivation oxide;
   patterning and etching the passivation oxide to form contact holes; and
   metallizing the structure to complete the memory transistor.

2. The method of claim 1 which further includes, after said patterning and etching the first layer of amorphous silicon, depositing a refractory metal on the first layer of amorphous silicon and the second layer of amorphous silicon, and performing a salicide process.

3. The method of claim 1 wherein said forming an ultrathin SOI layer on the substrate includes forming a top silicon layer having a thickness of between about 10 nm to 20 nm.

4. The method of claim 1 wherein said depositing a layer of silicon nitride includes depositing a layer of silicon nitride having a thickness of between about 10 nm to 50 nm.

5. The method of claim 1 wherein said depositing a first layer of amorphous silicon and said depositing a second layer of amorphous silicon includes depositing amorphous silicon to a thickness of between about 200 nm to 700 nm.

6. A method of fabricating an ultrathin SOI memory transistor, comprising:
   preparing a substrate, including forming an ultrathin SOI layer of the substrate;
   adjusting the threshold voltage of the SOI layer;
   depositing a layer of silicon oxide on the SOI layer;
   patterning and etching the silicon oxide layer to form a sacrificial oxide gate in a gate region;
   depositing a layer of silicon nitride and forming the silicon nitride into a silicon nitride sidewall for the sacrificial oxide gate;
   depositing a first layer of amorphous silicon;
   smoothing the layer of amorphous silicon by CMP;
   selectively etching the sacrificial gate oxide;
   growing a layer of oxide in the gate region;
   depositing a second layer of amorphous silicon;
   smoothing the second layer of amorphous silicon by CMP;
   depositing a refractory metal on the second layer of amorphous silicon and performing a salicide process;
   patterning and etching the first layer of amorphous silicon;
   implanting ions to form a source region and a drain region;
   annealing the structure to diffuse the implanted ions;
   depositing a layer of passivation oxide;
   patterning and etching the passivation oxide to form contact holes; and
   metallizing the structure to complete the memory transistor.

7. The method of claim 6 wherein said forming an ultrathin SOI layer on the substrate includes forming a top silicon layer having a thickness of between about 10 nm to 20 nm.

8. The method of claim 6 wherein said depositing a layer of silicon nitride includes depositing a layer of silicon nitride having a thickness of between about 10 nm to 50 nm.

9. The method of claim 6 wherein said depositing a first layer of amorphous silicon and said depositing a second layer of amorphous silicon includes depositing amorphous silicon to a thickness of between about 200 nm to 700 nm.

* * * * *